(12) United States Patent
Yanagisawa

(10) Patent No.: US 6,744,120 B1
(45) Date of Patent: Jun. 1, 2004

(54) FLEXIBLE INTERCONNECT SUBSTRATE OF A TAPE-SHAPED SEMICONDUCTOR DEVICE, SEMICONDUCTOR DEVICE AND CIRCUIT BOARD

(75) Inventor: Masahiko Yanagisawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/674,924

(22) PCT Filed: Mar. 8, 2000

(86) PCT No.: PCT/JP00/01388

§ 371 (c)(1), (2), (4) Date: Nov. 8, 2000

(87) PCT Pub. No.: WO00/54323

PCT Pub. Date: Sep. 14, 2000

(30) Foreign Application Priority Data

Mar. 11, 1999 (JP) ............................................. 11-065226

(51) Int. Cl.⁷ .......................... H01L 23/28; H01L 23/48; H01L 23/495
(52) U.S. Cl. ......................... 257/668; 257/666; 257/692; 257/693; 257/696; 257/691; 257/672; 257/673; 257/671
(58) Field of Search ................................. 257/668, 666, 257/692, 693, 696, 698, 671–673, 268

(56) References Cited

U.S. PATENT DOCUMENTS

| | | | | |
|---|---|---|---|---|
| 4,132,856 A | * | 1/1979 | Hutchison et al. ............ | 29/588 |
| RE29,906 E | * | 2/1979 | Jackson et al. ............... | 29/589 |
| 4,977,441 A | * | 12/1990 | Ohtani et al. | |
| 5,036,380 A | * | 7/1991 | Chase | |
| 5,046,953 A | * | 9/1991 | Shreeve et al. ............... | 29/840 |
| 5,121,053 A | * | 6/1992 | Shreeve et al. ............ | 174/52.4 |
| 5,310,055 A | * | 5/1994 | Chu ........................... | 206/328 |
| 5,524,765 A | * | 6/1996 | Gutentag .................... | 206/713 |
| 6,200,824 B1 | * | 3/2001 | Hashimoto .................. | 257/666 |
| 6,467,627 B1 | * | 10/2002 | Troxell, Jr. ................. | 206/714 |

FOREIGN PATENT DOCUMENTS

| | | | |
|---|---|---|---|
| EP | 0057253 | * | 8/1982 |
| JP | 2-45949 | * | 2/1990 |
| JP | 4-162440 | | 6/1992 |
| JP | 5-121486 | | 5/1993 |
| JP | 9-83092 | * | 3/1997 |

* cited by examiner

Primary Examiner—Alexander Oscar Williams
(74) Attorney, Agent, or Firm—Oliff & Berridge, PLC (57) ABSTRACT

A flexible interconnect substrate (1) comprises a tape-shaped base substrate (10) and a plurality of interconnect patterns (20) formed on the base substrate (10). The base substrate (10) has a plurality of first regions (44) met to be punched out, and second regions (45) between those first regions (44). Each of the second regions (45) has the material that forms the base substrate (10) is present in a central portion in the widthwise direction of the base substrate (10), and a low-bending-resistance portion (40) for ensuring that the second region (45) bends more readily than the adjacent first regions (44) in a direction in which the longitudinal axis of the base substrate (10) bends.

11 Claims, 8 Drawing Sheets

FLEXIBLE INTERCONNECT SUBSTRATE OF A TAPE-SHAPED SEMICONDUCTOR DEVICE, SEMICONDUCTOR DEVICE AND CIRCUIT BOARD

TECHNICAL FIELD

The present invention relates to a flexible interconnect substrate, a film carrier, a tape-shaped semiconductor device, a semiconductor device and a method of fabrication thereof, and a circuit board, together with electronic equipment.

BACKGROUND ART

The tape automated bonding (TAB) method is known in the art for mounting semiconductor chips auto a flexible interconnect substrate. Leads are formed on the flexible interconnect substrate and these leads are connected to pads of the semiconductor chips.

With this TAB method, the flexible interconnect substrate is curved and reel-to-reel processing is performed thereon, but when such a flexible interconnect substrate is wound onto a reel, the leads thereof may become bent.

DISCLOSURE OF THE INVENTION

The present invention was devised to solve this problem and has as an objective thereof the provision of a flexible interconnect substrate, a film carrier, a tape-shaped semiconductor device, a semiconductor device and a method of manufacturing the same, a circuit board, and electronic equipment that make it possible to prevent bending of the leads.

(1) A flexible interconnect substrate in accordance with the present invention comprises: a tape-shaped base substrate; and an interconnect pattern formed an the base substrate, wherein the base substrate includes: a first region in which a predetermined interconnect pattern has been formed and which will form a unit when separated from the base substrate; and a second region positioned next to the first region in the longitudinal direction of the base substrate; and wherein the second region has a low-bending-resistance portion which is formed in a region that excludes a central portion of the second region in the widthwise direction of the base substrate, for ensuing that the second region bends more readily in the direction in which the longitudinal axis of the base substrate bends, in comparison with the first region.

This aspect of the present invention ensures that a region (a second region) that is designed to bend more readily is provided adjacent to a region (a first region) that is to be punched out. When the flexible interconnect substrate is bent, stresses therefore concentrate in this second region, and thus the stress concentrations avoid the first region. This suppresses any bending of the interconnect pattern within the first region.

In addition, the low-bending-resistance portion is formed in a region that excludes the central portion in the widthwise direction of the base substrate within the second region, making it possible to suppress excessive deformation of the second regions, even when the base substrate in pulled in the longitudinal direction.

(2) In this flexible interconnect substrate, the low-bending-resistance portion may be one of through-holes, cuts, and a thinner portion.

A thinner portion makes the bending resistance lower, and through-holes or cuts reduce the bending resistance to zero. Thus the term "low-bending-resistance portion" includes any portion where the bending resistance is zero.

(3) In this flexible interconnect substrate, the configuration may be such that.

a high-bending-resistance portion in formed in each of the first region and the central portion of the second region in the widthwise direction of the base substrate;

the high-bending-resistance portion in formed to avoid a region that excludes the central portion of the second region in the widthwise direction of the base substrate; and the region avoided by the high-bending-resistance portion forms a relatively low-bending-resistance portion.

This configuration is not limited to a case in which the low-bending-resistance portion in formed deliberately; it could also apply to cases in which the bending resistance in reduced by an increase in the bending resistance in all other portions.

(4) In this flexible interconnect substrates the configuration may be such that:

a hole is formed in the first region of the base substrate; and a portion of the interconnect pattern is positioned within that hole.

With this configuration, the portion of the interconnect pattern that is positioned within the hole is not supported by the base substrate, but since the stresses concentrate in the second region, as described above, the bending of a lead that is positioned within the first region is suppressed.

(5) In this flexible interconnect substrate, the second region may be formed to bend more readily than the first region that bends readily due to the formation of the hole.

The formation of the hole makes it possible for the first region to bend more readily, but the second region bends even more readily than that first region, making it possible to avoid stress concentrations in the first region.

(6) In this flexible interconnect substrate, a plurality of the low-bending-resistance portions may be formed in a straight line within the second region, across the width of the base substrate.

This makes it easier for the second regions to bend.

(7) In this flexible interconnect substrate, the plurality of low-bending-resistance portions may be disposed on two edge portion sides of the base substrate, symmetrically with respect to the center in the widthwise direction of the base substrate.

This ensures that the substrate bends readily in a manner that is symmetrical across the width thereof.

(8) In this flexible interconnect substrate, the plurality of low-bending-resistance portions may be disposed on two edge portion sides of the base substrate, asymmetrically with respect to the center in the widthwise direction of the base substrate.

This makes it possible to ensure that the substrate bends readily in a manner that is asymmetrical across the width thereof.

(9) In this flexible interconnect substrate, the interconnect pattern may be formed to be offset towards either of two edge portions of the base substrate, with respect to the center in the widthwise direction of the base substrate.

This makes it possible to dispose the interconnect pattern in correspondence with a asymmetrical mode of bending.

(10) a tape-shaped semiconductor device in accordance with the present invention comprises the previously described flexible interconnect substrate; and a semiconductor chip connected electrically to the interconnect pattern of the base substrate.

With this aspect of the present invention, all the above described details of the flexible interconnect substrate apply.

(11) Another tape-shaped semiconductor device in accordance with the present invention comprises the previously described flexible interconnect substrate; and a semiconductor chip which in disposed offset towards either of two edge portions of the base substrate, with respect to the center in the widthwise direction of the base substrate, and which is connected electrically to the interconnect pattern of the base substrate.

With this aspect of the present invention, all the above described details of the flexible interconnect substrate apply.

(12) A semiconductor device in accordance with the present invention has a shape obtained by punching out the base substrate of the previously described tape-shaped semiconductor device along an outline that surrounds the semiconductor chip.

This semiconductor device is not limited to one obtained by punching out the tape-shaped semiconductor device as described above, but it can also apply to semiconductor devices that have the same configuration and shape as punched-out devices. Details of the flexible interconnect substrate are as described previously.

(13) A circuit board in accordance with the present invention is connected electrically to the previously described semiconductor device.

(14) Electronic equipment in accordance with the present invention comprises the previously described semiconductor device.

(15) A method of manufacturing a semiconductor device in accordance with the present invention comprises the steps of: winding the previously described flexible interconnect substrate onto a reel in preparation; and then pulling the flexible interconnect substrate out from the reel.

In this aspect of the present invention, the base substrate bends as the flexible interconnect substrate is wound up, but it is possible to suppress bending of the interconnect pattern because the previously described flexible interconnect substrate is used therefore.

(16) Another method of manufacturing a semiconductor device in accordance with the present invention comprises the steps or: winding a tape-shaped semiconductor device which comprises the previously described flexible interconnect substrate and a semiconductor chip connected electrically to the interconnect pattern of the flexible interconnect substrate, onto a reel in preparation; and then pulling the tape-shaped semiconductor device out from the reel.

In this aspect of the present invention, the base substrate bends as the flexible interconnect substrate is wound up, but it is possible to suppress bending of the interconnect pattern because the previously described flexible interconnect substrate is used therefore.

(17) In this method of manufacturing a semiconductor device, the flexible interconnect substrate may be punched out at the first region, during the step of pulling the tape-shaped semiconductor device out from the reel.

BEST MODE FOR CARRYING OUT THE INVENTION

Preferred embodiments to which this invention are applied will be described below with reference to the accompanying figures, but it should be noted that the present invention is not limited to the embodiments described herein.

Flexible Interconnect Substrate

Figure 1:
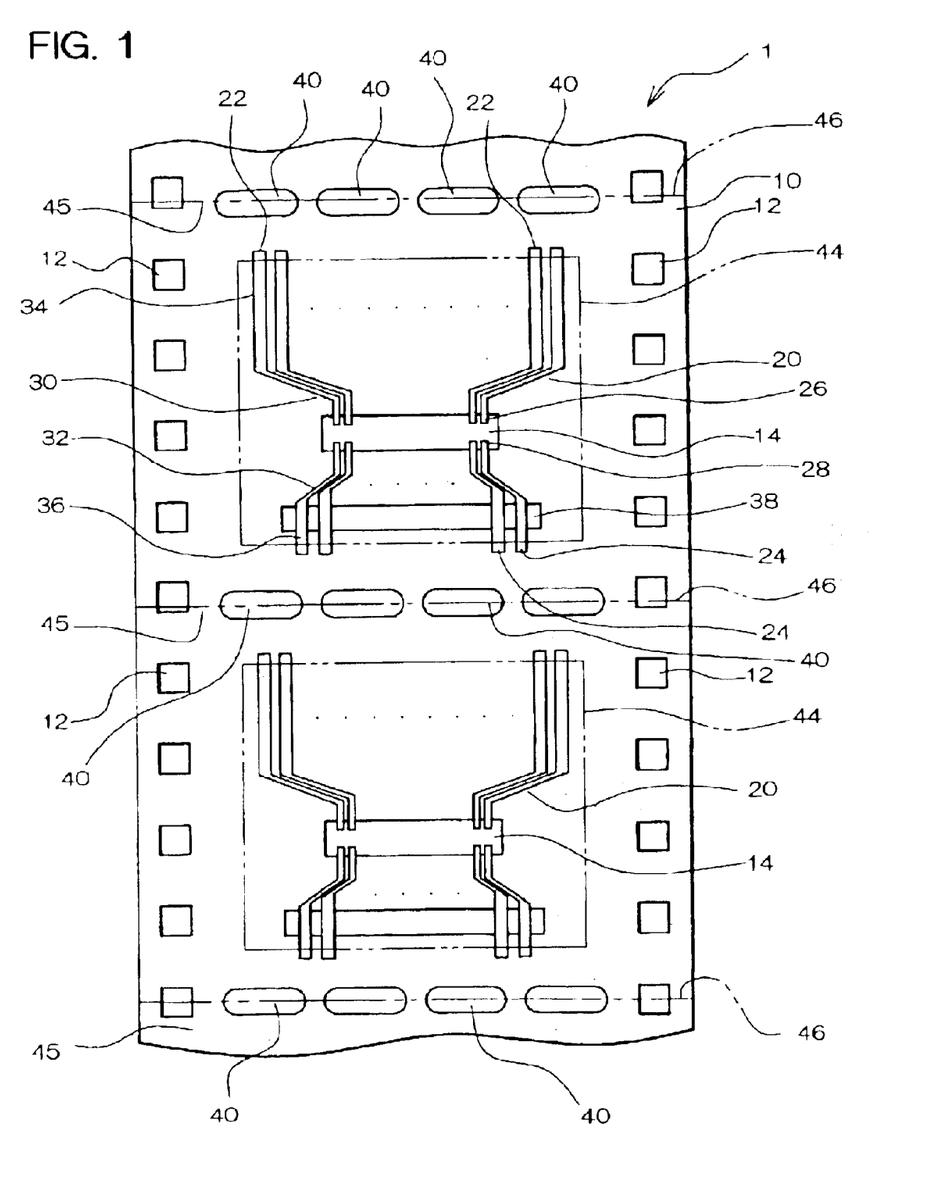
FIG. 1 shows a flexible interconnect substrate in accordance with an embodiment of the present invention.
Figure 2A:
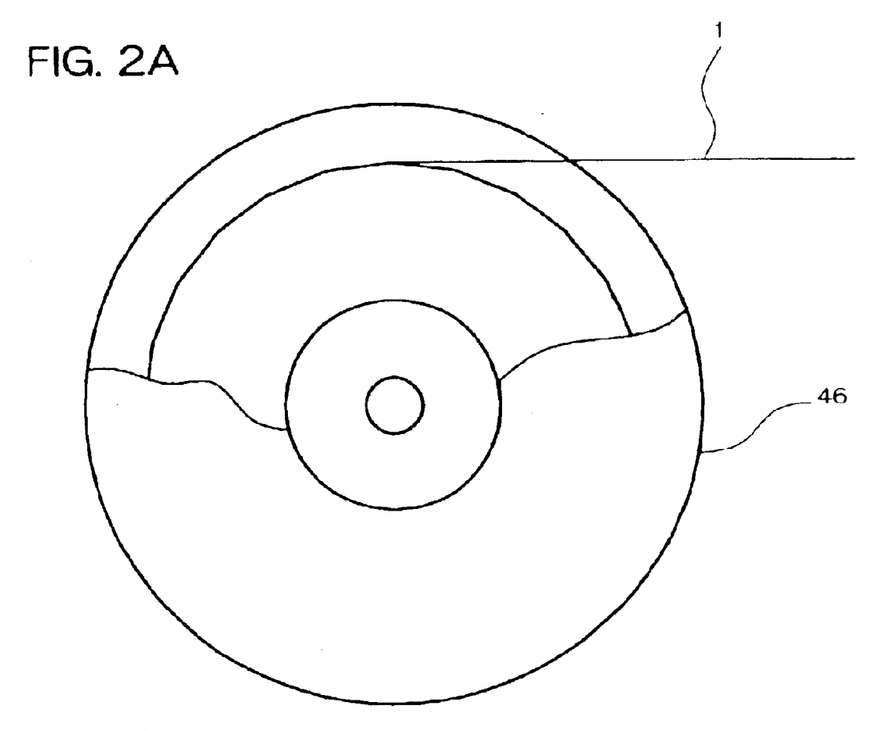
FIGS. 2A and 2B show a usage state of the flexible interconnect substrate in accordance with this embodiment of a the present invention.

A flexible interconnect substrate in accordance with an embodiment of this invention is shown in FIG. 1. This flexible interconnecting substrate 1 comprises a base substrate 10 and a plurality of interconnect patterns 20. The flexible interconnecting substrate 1 could be handled by being wound onto a reel 46, as shown in FIG. 2A. If the TAB technique is to be applied, the flexible interconnect substrate in a substrate for TAB (a film carrier tape), but it is not limited thereto and thus could equally well be a substrate for chip-on-film (COF) packaging or a substrate for chip-on-board (COB) packaging.

The base substrate 10 is a base material of a tape-shaped form that acts as a support member for the interconnect patterns 20. The base substrate 10 has flexibility. The base substrate 10 is frequently formed of a polyimide resin, but other known materials can be used therefor. It a plurality of sprocket holes 12 are formed in the lengthwise direction along both sides of the base substrate 10, with respect to the widthwise direction, the flexible interconnect substrate can be moved out by an engagement with sprockets (not shown in the figure).

If the TAB technique is to be used, one device hole 14 (or a plurality thereof overall) is formed in the interconnect patterns 20 on the base substrate 10. Bonding between a semiconductor chip 60 (see FIG. 4) and electrical connection portions therefor (such as inner leads 26 and 29) can be done through this device hole 14. The shape of the device hole 14 is not particularly limited, so it could be of a size sufficient to completely accommodate the semiconductor chip 60, or of a size that accommodates only part thereof.

A plurality of the interconnect patterns 20 are formed oh the base substrate 10. The base substrate 10 supports the interconnect patterns 20. With a flexible interconnect substrate 1 that has a three-layer substrate, the interconnect patterns 20 are attached to the base substrate 10 by an adhesive (not shown in the figure). With a flexible interconnect substrate that has a two-layer substrate, the interconnect patterns 20 are formed an the base substrate 10 with no adhesive therebetween.

The interconnect patterns 20 could be formed aligned in the longitudinal direction of the tape-shaped base substrate 10, or they could be formed across the width thereof, or they could be formed in a matrix form (aligned in both the longitudinal direction and the widthwise direction). The interconnect patterns 20 often have the same shape, but they can also be of different shapes. For example, a interconnect pattern group that is configured of an array of n interconnect patterns 20 of n different shapes could be formed repeatedly.

The interconnect patterns 20 can be formed of multiple layers of any of copper (Cu), chrome (Cr) titanium (Ti) nickel (Ni), or titanium-tungsten (Ti-W); or of an single layer of any of those metals. The interconnect patterns 20 are preferably plated with a material such as solder, tin, gold, or nickel. If metal plating is performed in such a manner that a euteotic is created, it is preferable that metal bonding is easy to achieve. To facilitate the electrical plating of a plurality of the interconnect patterns 20, they could be connected electrically by plating leads (not shown in the figure).

Each of the interconnect patterns 20 has a plurality of interconnects 22 and 24. More specifically, a plurality of interconnects 22 is formed in the longitudinal direction of the base substrate 10 on a first side of the device hole 14 (the upper side in FIG. 1) and a plurality of interconnects 24 is formed on a second side thereof (the lower side in FIG. 1)

Each of the interconnects 22 and 24 comprises an inner lead 26 or 28 at one end thereof, an oblique portion 30 or 32 that extends in a direction of an increasing spacing, and an end portion 34 or 36 at the other end thereof.

The inner leads 26 and 28 protrude into the device hole 14. The inner leads 26 and the inner leads 29 are each formed to be mutually parallel, and could be formed to extend in the longitudinal direction of the base substrate 10. The inner leads 26 and 28 act an electrical connection portions with the semiconductor chip 60.

The oblique portions 30 and 32 are foxed to be inclined with respect to the direction in which the spacing of the inner leads 26 and 28 increases. The oblique portions 30 and 32 could be formed to have either a linear shape or a curved shape.

The end portions 34 and 36 are set to extend from the oblique portions 30 and 32, on the opposite side from the inner leads 26 and 28. Each group of end portions 34 and end portions 36 is formed to be mutually parallel and could be formed to extend in the longitudinal direction of the base substrate 10. At least one of the width and pitch of the end portions 34 and 36 can be formed to be larger than that of the inner leads 26 and 28. The end portions 34 and 36 are connected electrically to other electrical components. In the example shown in FIG. 1, the end portions 36 of the interconnects 24 are formed to straddle an outer lead hole 38, and the portions of the end portions 36 that are within the outer lead hole 38 act as outer leads.

The base substrate 10 comprises a plurality of first regions 44 and a plurality of second regions 45. Each first region 44 is a region that is to be punched out. In the example shown in FIG. 1, each first region 44 is positioned in a central portion across the width of the base substrate 10. In other words, each first region 44 is positioned inward of edge portions of the base substrate 10 so that, when the base substrate 10 is punched out at the first region 44, both edge portions of the base substrate 10 are left, with respect to the width thereof. Alternatively, each first region 44 could comprise one side edge of the base substrate 10, or it could comprise the entire portion across the width of the base substrate 10 (from one side edge to the other side edge). At least part of each interconnecting pattern 20 is formed within one of the first regions 44. A plurality of the first regions 44 (not necessarily all of them) are positioned in a line along the longitudinal direction of the tape-shaped base substrate 10. Note that the semiconductor chip 60 (see FIG. 4) is mounted on one of the first regions 44 and the device hole 14 is formed within this first region 44.

The second regions 45 are positioned between the first regions 44. More specifically, each second region 45 is positioned between two of the first regions 44 that are adjacent in the longitudinal direction of the base substrate 10. Each second region 45 is a part of the base substrate 10 and comprises the entire portion thereof across the width thereof (from one side edge to the other side edge).

Apertures such as through-holes, slits, or cuts are not formed in a central portion of each second region 45 in the widthwise direction of the base substrate 10. In other words, there is some of the material at the central portion of the second region 45 in the widthwise direction of the base substrate 10. This makes it possible to ensure that deformation in not too great, even when the base substrate is pulled. Note that the material that does exist in the central portion of the second region 45 in the widthwise direction of the base substrate 10, could be a material that supports the interconnecting patterns 20 (ouch as a polyimide resin) or it could be a different material (such as a single layer of a weak material or a hard material Regardless of what type of material is used, this material forms part of the base substrate 10. Alternatively, the portion within the central portion of the second region 45 in the widthwise direction of the base substrate 10 could have a different thickness from the portion that supports the interconnect pattern 20. That is to say, the central portion of the second region 45 in the widthwise direction of the base substrate 10 could be formed to be either thinner or thicker At least one low-bending-resistance portion 40 is formed within each second region 45 (in FIG. 1, there are a plurality of low-bending-resistance portions 40). This low-bending-resistance portion 40 is designed to ensure that the second region 45 bends more readily than the first region 44. More specifically, each low-bending-resistance portion 40 bends easily in a direction such that the second region 45 bends along the longitudinal axis of the base substrate 10 (such as when the assembly is being wound on a reel). This ensures that when the base substrate 10 is being bent, such as when it is being wound, bending stresses concentrate in the second regions 45, avoiding bending stress concentrations at the first regions 44. As a result, there is little bending of the interconnecting patterns 20 within the first regions 44.

The low-bending-resistance portions 40 shown in FIG. 1 are slits, where these slits are formed to extend across the width of the base substrate 10. These low-bending-resistance portions 40 could also be through-holes cuts, or thinner portions. Alternatively, the low-bending-resistance portions 40 could be formed of a material that is weaker (and thus more bendable) than the material of the first regions 44. If the low-bending-resistance portions 40 are apertures such as slits, the bending resistance of the low-bending-resistance portions 40 is zero. If there is some material in the low-bending-resistance portions 40, such as in thinner portions, the low-bending-resistance portions 40 will have some bending resistance.

A plurality of the low-bending-resistance portions 40 could be formed at intervals across the width of the base substrate 10. In such a case, the low-bending-resistance portions 40 could be formed in a straight line across the width of the base substrate 10. In the example shown in FIG. 1, a plurality of the low-bending-resistance portions 40 are disposed symmetrically on either side with respect to the center of the width of the base substrate 10. In this case, "symmetrical" means that they are symmetrical in both shape and position, and the bending resistances thereof are also symmetrical.

Alternatively, one low-beading-resistance portion 40 could be formed across the width of the base substrate 10, straddling the center thereof, provided that the low-bending-resistance portion 40 is not apertures alone. The entire second region 45 could also be formed as the low-bending-resistance portion 40.

The second region 45 in which the low-bending-resistance portion 40 is formed preferably bonds more readily than regions of the adjacent first regions 44 that comprise portions of the interconnecting patterns 20 that are more likely to deform. Portions of the interconnecting patterns 20 that are not supported directly by the base substrate 10 are more likely to deform. Examples include portions of the interconnecting patterns 20 which are positioned within holes (such as the inner leads 26 and 28 and the end portions 36 that form outer leads, which are positioned within the device hole 14 and the outer lead hole 38). It is therefore preferable to ensure that the second region 45 bends more readily than the edge portions of the holes.

A protective film 42 (see FIG. 5) could be provided on top of the interconnecting patterns 20. The protective film 42 protects the interconnect patterns 20 from oxidation or the like. The protective film 42 could be formed of a resin such as solder resist. The protective film 42 is provided to cover is provided to cover the interconnect pattern 20 except for those portions in electrical contact with other components such as a semiconductor chip (such as the inner leads, external pins, and outer leads). The protective film 42 is provided to cover the interconnect patterns 20 except for those portions in electrical contact with other components such as a semiconductor chip (such as the inner leads 26 and 28, external pins, and outer leads).

Each of the interconnecting patterns 20 is used to fabricate one semiconductor device, and the flexible interconnecting substrate 1 is used to fabricate a plurality of semiconductor devices. The base substrate 10 is provided with a plurality of the first regions 44. Each first region 44 is punched out of the base substrate 10 to form a semiconductor device. One interconnecting pattern 20 is formed in each first region 44. The interconnecting pattern 20 could be formed to protrude from the first region 44. In other words, part of each interconnecting pattern 20 could be positioned outside the corresponding first region 44.

Figure 2B:
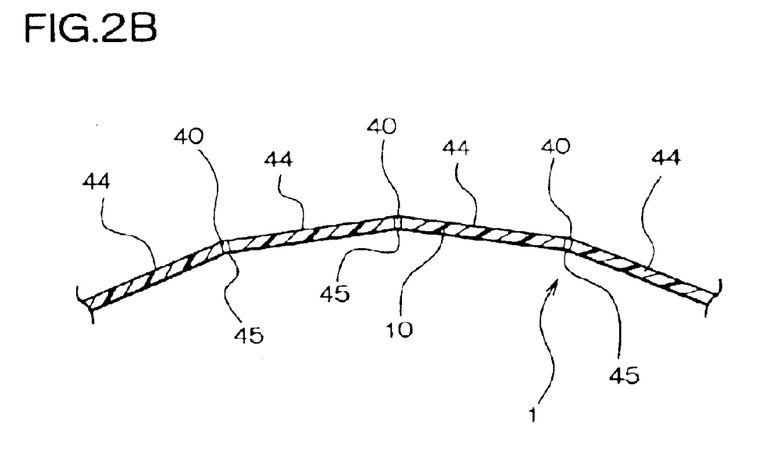

A usage state of the flexible interconnect substrate in accordance with this embodiment of the invention is shown in FIG. 2A, with a side view of part of the flexible interconnect substrate being shown in FIG. 2B. As shown in FIG. 2A, the flexible interconnecting substrate 1 is wound onto the reel 46. In this case, the axial line of the base substrate 10 in the longitudinal direction bends but the low-beading-resistance portions 40 are formed in the second regions 45 of the base substrate 10. Thus the second regions 45 formed in the low-bending-resistance portions 40 bend greatly because the bending stresses concentrate in those positions, so that there is little bending of the first regions 44 in which the low-bending-resistance portions 40 are not formed, as shown in FIG. 2B. The interconnecting patterns 20 are formed in the first regions 44 where there is little bending, as shown in FIG. 1, which makes it possible to suppress bending of the interconnecting patterns 20.

It is therefore possible to pull the flexible interconnecting substrate 1 off from the reel 46 and perform processing thereon, or perform reel-to-reel processing thereon.

Film Carrier

In a film carrier in accordance with another embodiment to which the present invention is applied, the flexible interconnect substrate of FIG. 1 is cut along lines in the widthwise direction (the broken lines indicated by reference numerals 48 in FIG. 1). For example, the film carrier is a piece of film cut from the above described flexible interconnect substrate. Note that the positions at which the flexible interconnect substrate is cut are not particularly limited. In the example shown in FIG. 1, both sides of one interconnect patterns 20 act as cutting positions, but both sides of a plurality of interconnect patterns 20 could sally well be used as cutting positions.

Method of Manufacturing a Tape-shaped Semiconductor Device

Figure 3:
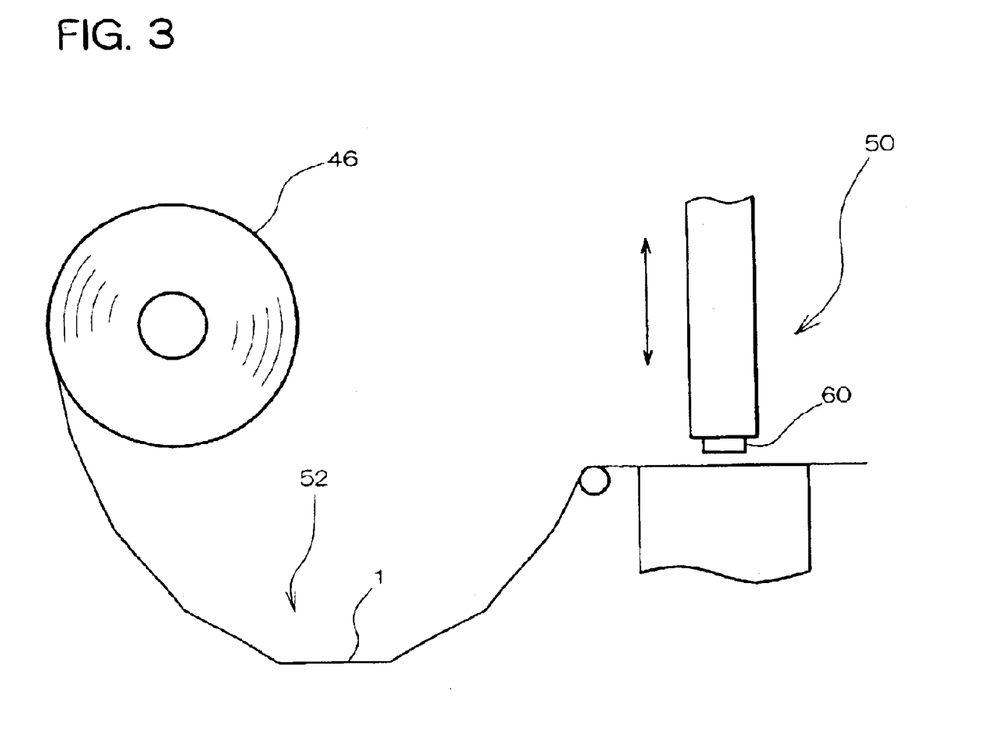
FIG. 3 shows a method of manufacturing a tape-shaped semiconductor device in accordance with an embodiment of the present invention.

The description now turns to a method of manufacturing a tape-shaped semiconductor device in accordance with an embodiment to which the present invention is applied, with reference to FIG. 3.

As shown in FIG. 3, the flexible interconnecting substrate 1 has been previously wound onto the reel 46 and is conveyed therefrom to a bonding unit 50 for mounting semiconductor chips. A buffer region (slack portion) 52 is provided between the reel 46 and the bonding unit 50, so that the amount by which the reel 46 is drawn out ensures that semiconductor chips can be mounted on the flexible interconnecting substrate 1, not necessarily in synchronization with the tact time of the bonding unit 50.

Since the flexible interconnecting substrate 1 is in a state such that it dangles under its own weight within the buffer region 52, it bends due to its own weight at the lowermost position thereof and thus bending stresses are applied to the flexible interconnecting substrate 1. However, the flexible interconnecting substrate 1 in accordance with this embodiment of the invention is provided with the low-bonding-resistance portions 40, so these bending stresses concentrate at the low-bending-resistance portions 40. It is therefore possible to prevent the bending stresses from concentrating at the electrical connection portion (such as the inner leads 26 and 28), preventing the occurrence of cracks and broken wires.

Tape-Shaped Semiconductor Device

Figure 4:
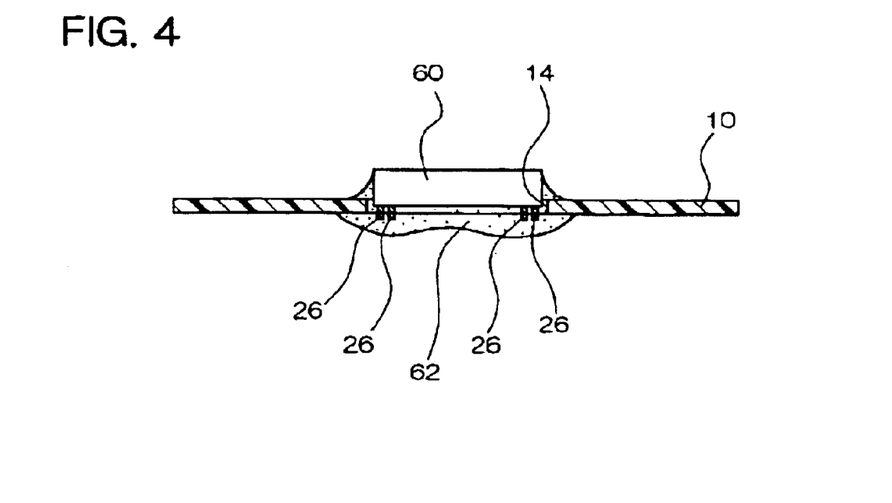
FIG. 4 shows a tape-shaped semiconductor device in accordance with an embodiment of the present invention.

A tape-shaped semiconductor device in accordance with a further embodiment to which this invention is applied is shown in FIG. 4, which in a cross-sectional view taken along a line across the width of the 10.

This tape-shaped semiconductor device has the above described flexible interconnecting substrate 1 and a plurality of semiconductor chips 60 that are connected electrically to the interconnect patterns 20 thereof.

The planar shape of each semiconductor chip 60 is generally quadrangular, but it could be either rectangular or square. A plurality of electrodes is formed on one surface of each semiconductor chip 60. The electrodes are aligned along at least one edge (or two or four edges, if more than one) of the surface of the semiconductor chip. If the outer shape of each semiconductor chip 60 is rectangular, electrodes could be arrayed in the longer direction thereof, as in an IC for a liquid crystal drive by way of example, or they could be arrayed in the shorter direction thereof. In some cases, the electrodes may be arrayed at an end portion of the surface of each semiconductor chip 60, or they may be arrayed at a central portion thereof. The electrodes are often configured of pads that are formed thinly and flat of a material such as aluminum, with bumps formed on top thereof. If bumps are not formed, the pads alone become electrodes. A passivation film (not shown in the figure) is formed over the semiconductor chips, except fox at least part of the electrodes. The passivation film can be formed of a material such as $SiO_2$, SiN, or polyimide resin, by way of example.

The electrodes of the semiconductor chips 60 could be bonded to the inner leads 26 and 28 of the interconnect patterns 20 through the device hole 14, by applying the TAB technique.

Alternatively, face-down bonding of the semiconductor chips 60 could be employed, if a flexible interconnect substrate with no device hole 14 is used. In such a came, the flexible interconnect substrate could be a substrate wherein the active surface of each semiconductor chip 60 (the surface on which electrodes are formed) and the base substrate are on opposite sides, in other words, chip-on-film (COF) mounting.

Alternatively, if wire bonding or the like is to be employed, each semiconductor chip 60 could be bonded face-up. In such a case, the active surface of the semiconductor chip 60 (the surface on which electrodes are formed) is orientated in the same direction as the mounting surface of the base substrate of the flexible interconnect substrate. For example, the electrodes of the semiconductor chip 60 could be connected to the interconnect pattern 20 by wires (fine wires) of metal to give a face-up-mounted substrate.

The tape-shaped semiconductor device could have a seal portion 62. The seal portion 62 seals in at least the electrical connection portions between the electrodes of the semiconductor chip 60 and the interconnect pattern 20 (such an the inner leads 26 and 28). This seal portion 62 is often formed of resin.

Figure 5:
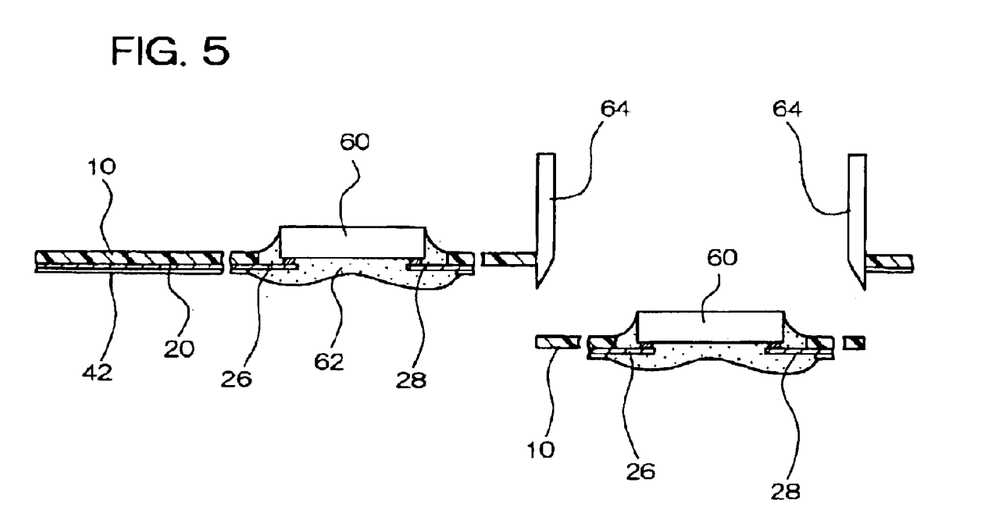
FIG. 5 shows a method of manufacturing a semiconductor device in accordance with an embodiment of the present invention.

In addition, the end portions of the protective film 42 preferably overlap the seal portion 62 at each boundary between portions of the interconnecting pattern 20 that are not covered by the protective film 42 and portions that are covered thereby (see FIG. 5). This makes it possible to prevent exposure of the interconnect pattern 20. The seal portion 62 could be provided by potting or it could be provided by a transfer sold.

Semiconductor Device and Method of Manufacturing the Same

A semiconductor device and method of manufacturing the same in accordance with a still further embodiment to which this invention is applied is shown in FIG. 5. This semiconductor device is formed by cutting the tape-shaped semiconductor device of FIG. 4 along lines that extend in the widthwise direction. The tape-shaped semiconductor device could be cut on both sides of one interconnect pattern 20, using cutting tools 64 (such as cutters or a punch), as shown in FIG. 5 by way of example. There cutting positions could be those indicated by the broken line 48 in FIG. 1.

The semiconductor device in accordance with this embodiment of the invention could be formed by punching out the base substrate 10 of the above described tape-shaped semiconductor device. The position of the punching could be along the outline of one interconnect pattern 20.

Semiconductor Device and Circuit Board

Figure 6:
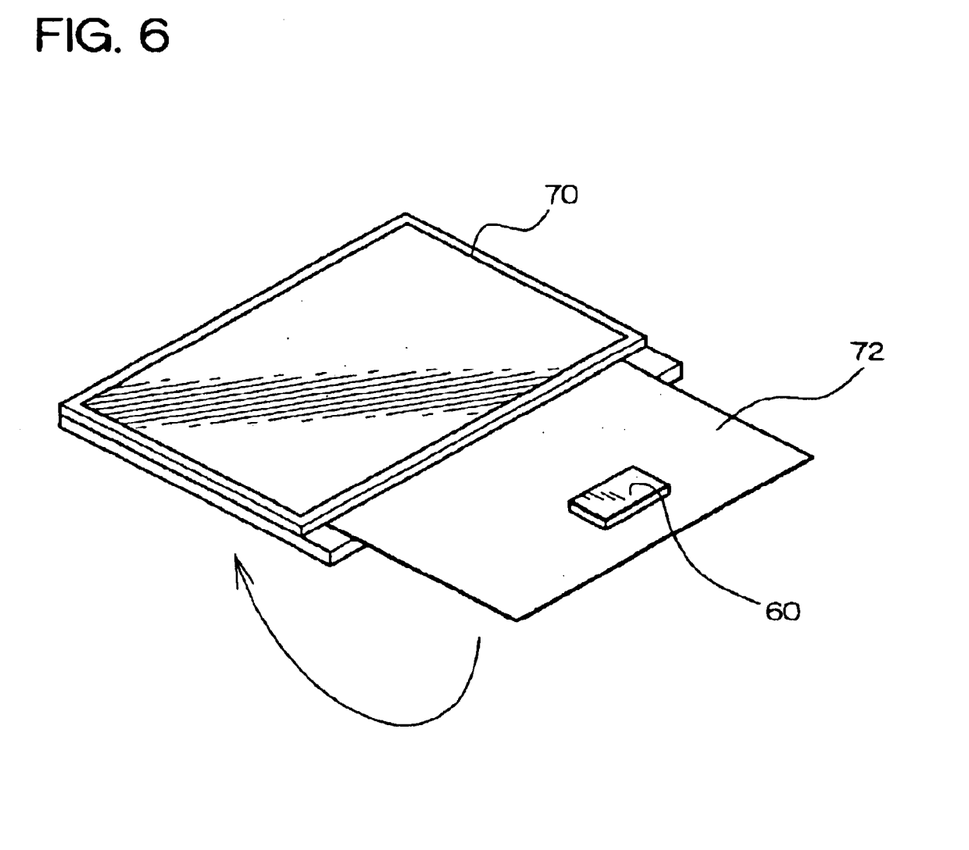
FIG. 6 shows a circuit board in accordance with an embodiment of the present invention.

A circuit board in accordance with yet another embodiment to which this invention is applied is shown in FIG. 6. As shown in FIG. 6, a semiconductor device 72 an described above is connected electrically to a circuit board 70. The circuit board 70 could be a liquid crystal panel, by way of example. The semiconductor device 72 is formed by punching out the base substrate 10 of the tape-shaped semiconductor device around the outline that encompasses the semiconductor chip 60.

The base substrate 10 of the semiconductor device 72 could also be provided with bends, as shown in FIG. 6. For example, the base substrate 10 could be made to bend around an end portion of the circuit board 70.

Electronic Equipment

Figure 7:
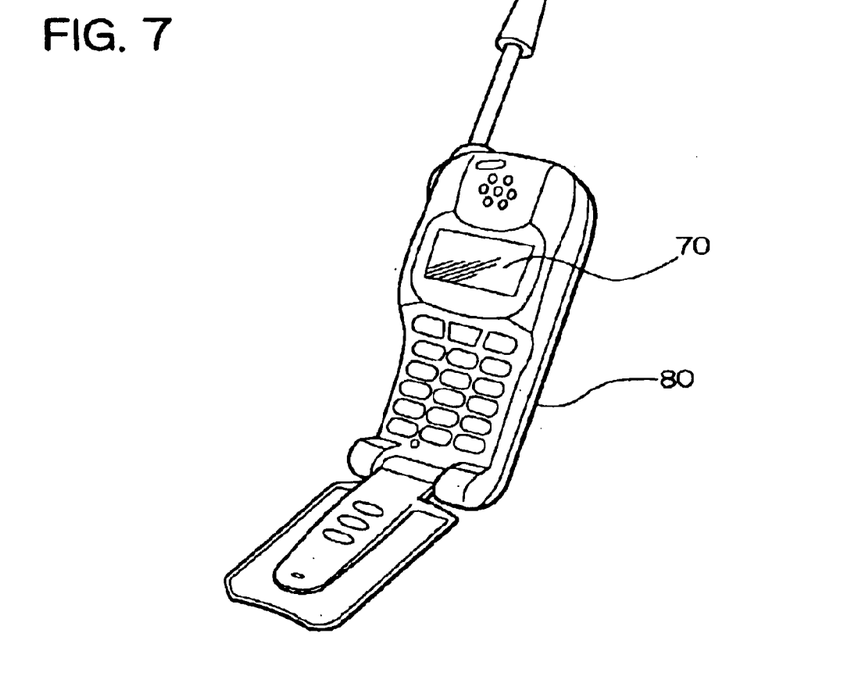
FIG. 7 shows an item of electronic equipment having a semiconductor device in accordance with this embodiment.
Figure 8:
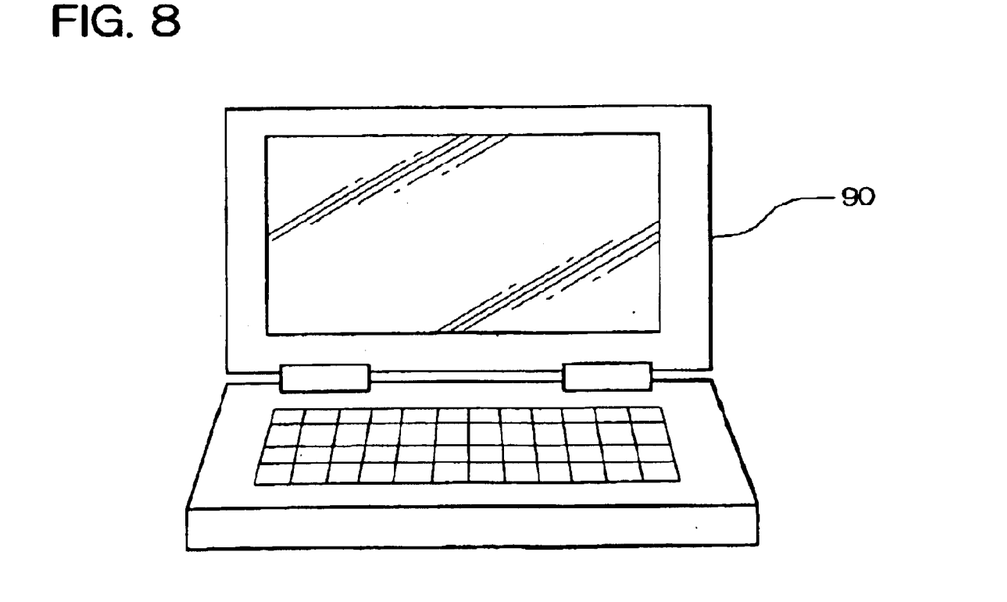
FIG. 8 shows another item of electronic equipment having a semiconductor device in accordance with this embodiment.

A portable telephone 180 is shown in FIG. 7 as an example of electronic equipment having a semiconductor device to which this invention is applied. This portable telephone 180 has the circuit board 70 (liquid crystal panel) to which this invention is applied. A notebook-sized personal computer 190 having a semiconductor device (not shown in the figure) to which this invention is applied is shown in FIG. 8.

Note that the "semiconductor chip" that is a structural component of the present invention could he replaced by an "electronic element," and electronic elements (either active elements or passive elements) can be mounted on a flexible interconnect substrate or film carrier to fabricate an electronic component, in a manner similar to that of a semiconductor element. Examples of electronic components fabricated by using such electronic elements include optical elements, resistors, capacitors, coils, oscillators, filters, temperature sensors, thermistors, varistors, variable resistors, or fuses, by way of example.

Modifications

Figure 9:
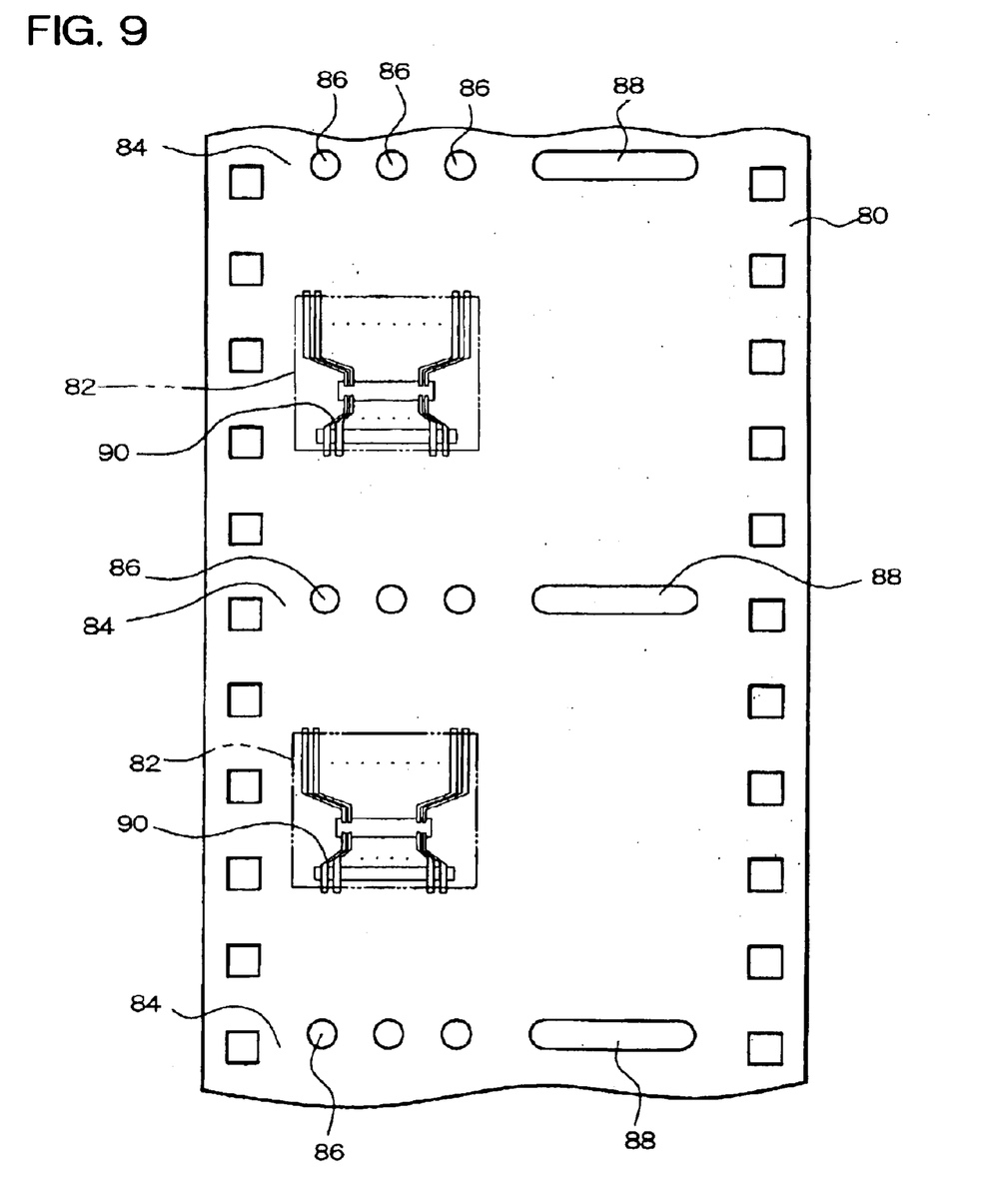
FIG. 9 shows a modification of a flexible interconnect substrate in accordance with an embodiment of the present invention.

A flexible interconnect substrate in accordance with a modification of an embodiment to which the present invention is applied is shown in FIG. 9. This flexible interconnect substrate comprises a base substrate 80 and interconnect patterns 90. The base substrate 80 comprises a first region 82 and a second region 84, and low-bending-resistance portion 86 and 88 are formed in the second region 84.

The low-bending-resistance portions 96 and 98 are disposed asymmetrically on either side with respect to the central portion in the widthwise direction of the base substrate 80. In this case, "asymmetrically"0 means either that the shapes, numbers, or positions thereof are asymmetrical or that the bending resistances thereof are a asymmetrical. In the example shown in FIG. 9, a plurality of low-bending-resistance portions 86 are formed on the side of one edge portion and a small number (such as one) of low-bending-resistance portions 88 is formed on the side of another edge portion thereof. The low-bending-resistance portions 86 on one side are circular, by way of example. The other low-bending-resistance portions 88 are elongated holes, by way of example, that are formed to extend across the width of the base substrate 80. Since the asymmetrical low-bending-resistance portions 86 and 88 are formed in the base substrate 80 in this manner, the base substrate 80 can be made to bend readily in a asymmetrical manner.

The, interconnect patterns 90 are positioned offset towards one edge portion, with reference to the central portion in the widthwise direction of the base substrate 80. The interconnect patterns 90 could be formed offset towards the parts of the low-bending-resistance portions 36 and 88 that bend more readily, by way of example. This ensures that portions within each second region 84, where bending stresses readily concentrate, are close to the interconnect patterns 90, thus reducing the bending in the interconnect patterns 90. In this case, each first region 62 is positioned offset towards one edge portion with respect to the central portion in the widthwise direction of the base substrate 90.

In all other respects, details given with reference to the previously described embodiments apply also to this modification.

Figure 10A:
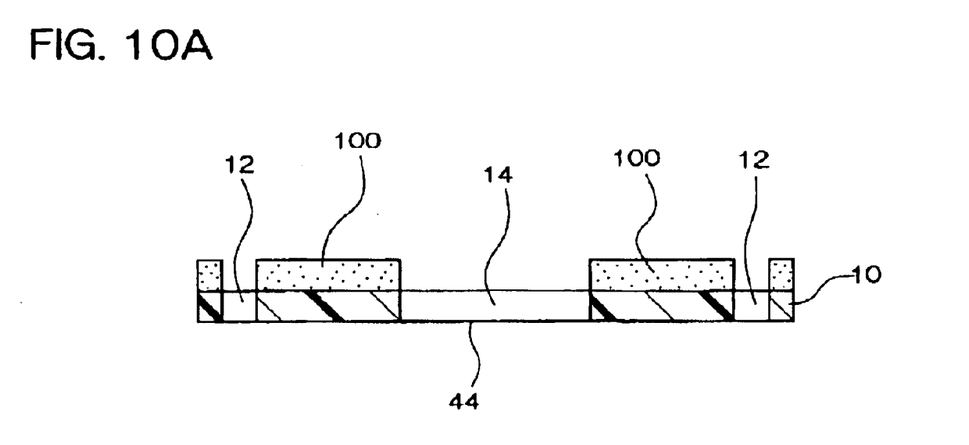
FIGS. 10A and 10B show another modification of the flexible interconnect substrate in accordance with an embodiment of the present invention.
Figure 10B:
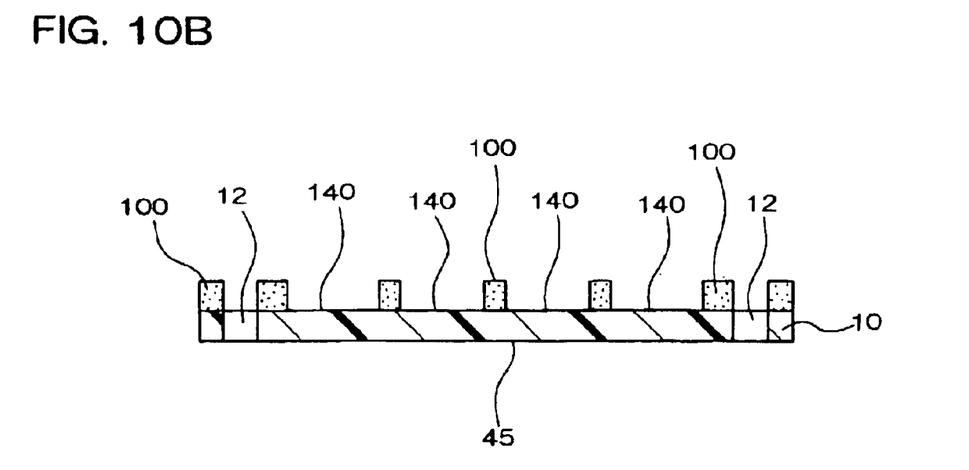

A flexible interconnect substrate in accordance with another modification of an embodiment to which the prevent invention is applied is shown in FIGS. 10A and 10B. This flexible interconnect substrate has the same configuration as the base substrate 10 that was described with reference to FIG. 1. FIG. 10A is a cross-sectional view of a first region 44 of the base substrate 10 and FIG. 10B is a cross-sectional view of a second region 45 of the base substrate 10. The device hole 14 and the sprocket holes 12 are formed in the base substrate 10.

High bending resistance portions 100 are formed on top of the base substrate 10. The high-bending-resistance portions 100 are designed to have a bending resistance that is higher than that of the region on which they are formed, and are preferably more rigid than the base substrate 10. The high-bending-resistance portions 100 could be formed of a substrate that is more rigid than the base substrate 10 or they could be formed of a resist (solder resist), by way of example. Alternatively, the formation of the high-bending-resistance portions 100 ensures that, if the bending resistance of the thus formed region is increased, the rigidity thereof could make use of the high-bending-resistance portions 100 of a rigidity that is the same as or less than that of the base substrate 10.

A shown in FIG. 10A, the high-bending-resistance portions 100 are formed in the first region 44, but they are also formed to exclude portions of the second region 45. The high-bending-resistance portions 100 are formed within a central portion in the widthwise direction of the base substrate 10, even in the second region 45. The parts of the second region 45 in which the high-bending-resistance portions 100 are not formed act as relatively low-bending-resistance portions 140. In other words, the low-bending-resistance portions 140 are formed in parts of the second region that avoid the central portion in the widthwise direction of the base substrate 10.

The low-bending-resistance portions 140 are formed in regions of the second region 45 that avoid the central portion in the widthwise direction of the base substrate 10. The formation of the low-ending-resistance portions 140 makes the second region 45 more likely to bend than the first region 44 in the direction in which the longitudinal axis curves.

Details that have been described with reference to FIG. 10 can also be applied to the previously described embodiment and modification of the present invention.

The description now turns to an example in which the present invention is applied to film carrier tape. The form of the film carrier tape in accordance with this embodiment has already been described with reference to FIG. 1. The Film carrier tape in accordance with this embodiment shown in FIG. 1 is fabricated by first forming the device hole 14 and the outer lead hole 38 in a tape-shaped substrate (the base substrate 10) that has flexibility, then providing the interconnect patterns 20 around these holes.

The tape-shaped substrate is a film made of a polyimide, a plurality of sprocket holes 12 is provided at uniform spacing in the longitudinal direction along both edges across the width of the tape-shaped substrate, so that the tape-shaped substrate can be moved in the direction of transfer by the engagement of sprockets (not shown in the figure) provided in the transfer path.

A plurality of punch-out regions (the first regions 44) are provided in this tape-shaped substrate along the longitudinal direction thereof , to correspond to the outer shapes of punch-out regions for the film carrier.

The device hole 14, which is of a size just sufficient to accommodate the semiconductor chip 60 (see FIG. 4), and the outer lead hole 38, which in adjacent to this device hole 14, are provided within each of these punch-out regions, and slits (as an example of the low-bending-resistance portions 40) that form bendable portions are provided on the outer sides of the punch-out regions, in other words, between adjacent punch-out regions. The interconnect pattern 20 is formed between the device hole 14 and the outer lead hole 38. One end of the interconnect pattern 20 is made to protrude from the edge of the device hole 14, to act as the inner leads 28 for the input side which are intended to connection pins that are formed in the surface of the semiconductor chip 60. The interconnect pattern 20 is drawn out to extend over the outer lead hole 38, on the opposite side of the interconnect pattern 20 from that of the inner leads 28 for the input side. The parts of the interconnect pattern 20 that straddle the outer lead hole 38 act as outer leads which are intended to connection pins that are formed in an external substrate (not shown in the figures).

The inner leads 26 for the output side are formed on the opposite side of the device hole 14 from the inner leads 28 for the input side. The inner leads 26 for the output side are also formed to protrude in such a manner that there is a number thereof equivalent to the number of connection pins of the semiconductor chip 60. The interconnect pattern 20 that acts as one side-edge portion of the inner leads 26 for the output side are drawn out to extend to the opposite side on which the outer lead hole 38 is formed, the thus extended portion is subjected to solder plating to provide connections with another external substrate, so that solder lands are formed thereby.

The slits (as one example of the low-bending-resistance portions 40) that are formed between the punch-out regions (the first regions 44) are formed in a plurality of lateral rows in such a manner that the longitudinal direction thereof matches the widthwise direction of the tape-shaped substrate. The configuration is such that, when the tape-shaped substrate (the base substrate 10) is subjected to bending in the longitudinal direction thereof, the regions in which these slits are formed has the lowest bending resistance. In other words, if the shape of the slits when they are formed is set in such a manner that the proportion occupied by the slits across the width of the tape-shaped substrate is greater than that of the holes in other regions, the dimensions of the substrate material is less than those in the other regions, making it possible to minimize bending resistance.

During the process of manufacturing the thus configured film carrier tape, the device hole 14, the outer lead hole 38, and the slits are punched out of the tape-shaped substrate simultaneously, then copper foil is laminated over the surface of the tape-shaped substrate, and the copper foil is exposed and etched to form the interconnect pattern 20. The film carrier tape that is fabricated by this sequence later accepts the semiconductor chip 60 in the device hole 14 and the inner leads 26 and 28 are connected electrically. The semiconductor chip 60 is then sealed into protective resin and the film carrier is punched out along the outer shape of the punch-out region. The semiconductor chip 60 thus forms a semiconductor device mounted on the film carrier.

The above described manufacturing process can have a number of fabrication lines within each step, instead of having the entire process running along the transfer direction of the tape-shaped substrate, as in a single fabrication line. The film carrier tape is wound onto the reel 46 in a roll at the far end of each predetermined fabrication line and also that reel 46 is placed at the start of the next-stage fabrication line, so that the film carrier tape can be sent out for the next-stage fabrication line.

Cross-sectional views of portions of the film carrier tape when wound onto the reel 46 are shown in FIGS. 2A and 2B. If the near end of the film carrier tape is attached to the core of the reel 46 and the film carrier tape is wound around that core, as shown in FIG. 2A, the film carrier tape forms a roll and the outer dimensions of that roll increases as the amount of tape wound thereon increases. In this case, the winding of the film carrier tape onto the reel 46 causes bending stresses to act thereon, but the provision of slits (the low-bending-resistance portions 40) in the film carrier tape ensures that the resistance to bending is low at the regions provided with those slits. This means that bending stresses concentrate at those portions and thus the film carrier tape is bent into a polygonal shape with the regions of the slits acting as vertices, au shown in FIG. 23. For that reason, there is no concentration of stresses due to bending at the portions either side of the regions provided with slits, in other words, the regions in which the outer lead holes 30 are formed. It is therefore possible to prevent bending stress concentrations at the outer leads formed in each outer lead hole 38, thereby preventing the occurrence of cracking and breakage of the outer leads.

The form of the fabrication line in which the semiconductor chips 60 are mounted on the film carrier tape will now be described with reference to FIG. 3. The film carrier tape that is drawn out from the reel 46, as shown in FIG. 3, is inserted into the bonding unit 50 of this fabrication line, where the semiconductor chips 60 are mounted. The buffer region (slack portion) 52 is provided between the reel 46 and the bonding unit 50, so that the amount by which the reel 46 is drawn out ensures that semiconductor chips 60 can be mounted on the flexible interconnecting substrate 1, not necessarily in synchronization with the tact time of the bonding unit 50.

Since the film carrier tape is in a state ouch that it dangles under its own weight within the buffer region 52, it bends due to its own weight at the lowermost position thereof and thus bending stresses are applied to the film carrier tape. However, the film carrier tape is provided with regions having slits and thus the bending resistance at those portions is small, to that bending stresses concentrate at those portions and thus the film carrier tape is bent into a polygonal shape with the regions of the slits acting as vertices. For that reason, there is no concentration of stresses due to bending at the portions either side of the regions provided with slits, in other words, the regions in which the outer lead holes 38 are formed. It is therefore possible to prevent bending stress concentrations at the outer leads formed in each outer lead hole 38, thereby preventing the occurrence of cracking and breakage of the outer leads.

In addition, the stresses are made to concentrate in the regions in which the slits the low-bending-resistance portions 40) are formed, so that there are no bending stress concentrations on the punch-out regions (the first regions 44). There is therefor no deformation, not only of the outer leads but also of the inner leads 28 for the input side and the inner leads 26 for the output side, making it possible to position the inner leads and the semiconductor chip accurately.

Note that this embodiment of the invention was described with reference to positions where semiconductor chips are mounted on a file carrier tape, but the present invention in not limited to such positions and similar effects can be obtained by the buffer region 52 for other locations at which bending stresses are applied to the file carrier tape.

In the method of manufacturing a film carrier tape in accordance with this embodiment of the invention, punch-out regions (the first regions 44) are met in sequence along the longitudinal direction of a tape-shaped substrate (the base substrate 10) that has flexibility, then bendable portions are provided between the punch-out regions in such a manner that the bending resistance thereof is less than that of the punch-out regions. Since the method of manufacturing film carrier tape in accordance with this embodiment of the invention ensures that the regions between the punch-out regions bend readily, any attempt to bend the film carrier tape causes the bending stresses concentrate at those bendable portions so that the film carrier tape bends at the bendable portions into a polygonal shape, thereby making it possible to prevent bending stress concentrations at the punch-out regions.

Note that it does not matter what is done at the bendable portions to reduce the bending resistance of the tape-shaped substrate, more specifically, there could equally well be slits formed in the lateral direction (the widthwise direction) of the tape-shaped substrate, cuts introduced in the lateral direction of the tape-shaped substrate, or a lessening of the thickness of the tape-shaped substrate.

The method of manufacturing a film carrier tape in accordance with this embodiment of the invention also includes a process in which punch-out regions (the first regions 44) are set in sequence along the longitudinal direction of a tape-shaped substrate (the base substrate 10) that has flexibility, the device holes 14 and the neighboring outer lead holes 38 are formed within these punch-out regions, then the interconnect patterns 20 are formed, each with one end portion protruding from a device hole 14 and another end portion straddling an outer lead hole 38. Before the interconnect patterns 20 are formed, slits are formed between the punch-out regions. This ensures that the bending resistance of the tape-shaped substrate between the punch-out regions is less than the bending resistance or the regions in which are formed the outer lead holes 38 that are straddled by the interconnect patterns 20. When the film carrier tape itself bends, the resultant bending stresses concentrate between the punch-cut regions, that is, at the regions in which the slits are formed, so that there are no bending stress concentrations in the regions in which the outer lead holes 39 are formed, thus making it possible to prevent the application of stress to the outer leads. Forming the slits before the step of forming the interconnect patterns 20 makes it possible to prevent the application of stress to the interconnect patterns 20 from the very start of their formation.

A film carrier tape in accordance with this embodiment of the invention comprises a tape-shaped substrate (the base substrate 10) that has flexibility, punch-out regions that are set in sequence along this tape-shaped substrate, and bendable portions formed between the punch-out regions. The bending resistance between the punch-out regions is less than the bending resistance of the punch-out regions. With the film carrier tape in accordance with this embodiment of the invention, the bendable portions ensure that the bending resistance between the punch-out regions is lower. Thus, when an attempt is made to bend the film carrier tape, the bending stresses concentrate at the bendable portions, making it possible to reduce the severity of bending in the punch-out regions, with no bending stress concentration in these punch-out regions.

The film carrier tape in accordance with this embodiment of the invention comprises a tape-shape substrate (the base substrate 10) that has flexibility. Punch-out regions are formed in sequence along this tape-shaped substrate, and a device hole 14 is formed within each of these punch-out regions. Within each punch-out region is also farmed an outer lead hole 38 adjacent to the device hole 14, and an interconnect pattern 20 which has an end portion that protrudes from the device hole 14 and another end portion that straddles the outer lead hole 38. Slits are formed by punching out between the punch-out regions. The bending resistance between the punch-out regions is made to be less than the bending resistance of regions in which are fore the outer lead holes 38 that are straddled by the interconnect pattern. 20. With the film carrier tape in accordance with this embodiment of the invention, any attempt to bend the film carrier tape applies bending stresses to the entirety thereof, but the provision of places in which slits are formed, with the weakest bending resistance, between the punch-out regions ensures that the bending stresses concentrate at those portions and the film carrier tape takes up a polygonal shape. In other words, there are no stress concentrations due to bending at the outer lead hole 38, and thus no stresses are applied to the outer leads that straddle the outer lead hole 38. This makes it possible to prevent cracking or breakage of the outer leads.

In the film carrier tape in accordance with this embodiment of the invention, the slits are formed in such a manner that the proportion occupied by the slits across the width of the tape-shaped substrate (the base substrate 10) is greater than the proportion occupied by the outer lead holes 38 across the width of the tape-shaped substrate. With the film carrier tape in accordance with this embodiment of the invention, the remaining amount of the material of the substrate is least within regions in which the slits are formed, making it possible to reduce the bending resistance thereof below that of the other regions in which the outer lead holes 38 are formed.

What is claimed is:

1. A flexible interconnect substrate comprising:
    a tape-shaped base substrate; and
    an interconnect pattern formed on the base substrate,
    wherein the base substrate includes:
        a first region in which a portion of the interconnect pattern has been formed and which will form a unit when separated from the base substrate; and
        a second region positioned next to the first region in the longitudinal direction of the base substrate; and
    wherein the second region has low-bending-resistance portions which are formed asymmetrically in regions, that exclude and sandwich a central portion of the second region in the widthwise direction of the base substrate, on either side with respect to the central portion for ensuring that the second region bends more readily in the direction in which the longitudinal axis of the base substrate bends, in comparison with the first region,
    wherein the whole portion of the interconnect pattern in the first region extends across the widthwise direction of the base substrate.

2. The flexible interconnect substrate as defined in claim 1,
    wherein each of the low-bending-resistance portions is one of through-holes, cuts, and a thinner portion.

3. The flexible interconnect substrate as defined in claim 1,
    wherein a high-bending-resistance portion is formed in each of the first region and the central portion of the second region in the widthwise direction of the base substrate;
    wherein the high-bending-resistance portion is formed to avoid regions that exclude the central portion of the second region in the widthwise direction of the base substrate; and
    wherein the regions avoided by the high-bending-resistance portion relatively form the low-bending-resistance portions.

4. The flexible interconnect substrate as defined in claim 1,
    wherein a hole is formed in the first region of the base substrate; and
    wherein a portion of the interconnect pattern is positioned within the hole.

5. The flexible interconnect substrate as defined in claim 4,
    wherein the second region is formed to bend more readily than the first region that bends readily due to the formation of the hole.

6. The flexible interconnect substrate as defined in claim 1,
    wherein the low-bending-resistance portions are formed in a straight line within the second region, across the width of the base substrate.

7. The flexible interconnect substrate as defined in claim 6,
    wherein the low-bending-resistance portions are disposed on two edge portion sides of the base substrate, symmetrically with respect to the center in the widthwise direction of the base substrate.

8. A tape-shaped semiconductor device comprising:
    the flexible interconnect substrate as defined in claim 1; and
    a semiconductor chip connected electrically to the interconnect pattern of the base substrate.

9. A method of manufacturing a semiconductor device, comprising the steps of:
    winding the flexible interconnect substrate as defined in claim 1 onto a reel in preparation; and then
    pulling the flexible interconnect substrate out from the reel.

10. A method of manufacturing a semiconductor device, comprising the steps of:
    winding a tape-shaped semiconductor device which comprises the flexible interconnect substrate as defined in claim 1 and a semiconductor chip connected electrically to the interconnect pattern of the flexible interconnect substrate, onto a reel in preparation; and then
    pulling the tape-shaped semiconductor device out from the reel.

11. The method of manufacturing a semiconductor device as defined in claim 10,
    wherein the flexible interconnect substrate is punched out at the first region, during the step of pulling the tape-shaped semiconductor device out from the reel.

* * * * *

UNITED STATES PATENT AND TRADEMARK OFFICE
CERTIFICATE OF CORRECTION

PATENT NO. : 6,744,120 B1
DATED : June 1, 2004
INVENTOR(S) : Masahiko Yanagisawa It is certified that error appears in the above-identified patent and that said Letters Patent is hereby corrected as shown below:

<u>Title page, Item [54] and Column 1, lines1-4,</u>
Title, "FLEXIBLE INTERCONNECT SUBSTRATE OF A TAPE-SHAPED SEMICONDUCTOR DEVICE, SEMICONDUCTOR DEVICE AND CIRCUIT BOARD" should read -- A FLEXIBLE INTERCONNECT SUBSTRATE OF A TAPE-SHAPED SEMICONDUCTOR DEVICE, SEMICONDUCTOR DEVICE AND CIRCUIT BOARD --

Signed and Sealed this

Seventeenth Day of May, 2005

JON W. DUDAS
*Director of the United States Patent and Trademark Office*